United States Patent [19]

Shiota et al.

[11] Patent Number: 5,514,259
[45] Date of Patent: May 7, 1996

[54] SPUTTERING APPARATUS

[75] Inventors: Junji Shiota, Tachikawa; Ichiro Ohno, Hachioji; Hidetaka Uchiumi, Tachikawa, all of Japan

[73] Assignee: Casio Computer Co., Ltd., Tokyo, Japan

[21] Appl. No.: 158,821

[22] Filed: Nov. 26, 1993

Related U.S. Application Data

[63] Continuation of Ser. No. 989,951, Dec. 10, 1992, abandoned, which is a continuation of Ser. No. 869,842, Apr. 16, 1992, abandoned, which is a continuation of Ser. No. 621,357, Dec. 3, 1990, abandoned.

[30] Foreign Application Priority Data

Dec. 7, 1989 [JP] Japan ................... 1-316365

[51] Int. Cl.$^6$ .................................... C23C 14/34
[52] U.S. Cl. .................... 204/298.19; 204/192.12; 204/298.07; 204/298.09; 204/298.11; 204/298.14; 204/298.25; 204/298.15
[58] Field of Search .................. 204/298.11, 298.09, 204/298.14, 298.07, 298.15, 298.16, 298.19, 298.23, 298.24, 298.25, 298.26, 192.12; 414/217, 222

[56] References Cited

U.S. PATENT DOCUMENTS

| | | | |
|---|---|---|---|
| 4,116,806 | 9/1978 | Love et al. ................ | 204/298 |
| 4,198,283 | 4/1980 | Class et al. ................ | 204/298.19 X |
| 4,395,323 | 7/1983 | Denton et al. .............. | 204/298.14 X |
| 4,401,539 | 8/1983 | Abe et al. .................. | 204/298.19 X |
| 4,427,524 | 1/1984 | Crombeen et al. .......... | 204/298.19 X |
| 4,558,388 | 12/1985 | Graves, Jr. ................. | 204/298.25 X |
| 4,749,465 | 6/1988 | Flint et al. .................. | 204/298.25 |
| 4,798,663 | 1/1989 | Herklotz et al. ............ | 204/298.19 X |
| 4,824,545 | 4/1989 | Arnold et al. .............. | 204/298.25 |
| 4,931,169 | 6/1990 | Scherer et al. ............. | 204/298.19 X |
| 4,946,576 | 8/1990 | Dietrich et al. ............ | 204/298.14 X |
| 4,975,168 | 12/1990 | Ohno et al. ................ | 204/298.25 X |
| 5,026,471 | 6/1991 | Latz et al. .................. | 204/298.19 |

FOREIGN PATENT DOCUMENTS

| | | |
|---|---|---|
| 0072618 | 2/1983 | European Pat. Off. . |
| 0088463 | 9/1983 | European Pat. Off. . |
| 0148504 | 7/1985 | European Pat. Off. . |
| 0211412 | 2/1987 | European Pat. Off. . |

OTHER PUBLICATIONS

Review of Scientific Instruments, vol. 54, No. 5, May 1983, pp. 633–635 "Substrate Heater and Biasing Electrode Assembly for RF Sputtering Unit".

Primary Examiner—Nam Nguyen
Attorney, Agent, or Firm—Frishauf, Holtz, Goodman, Langer & Chick

[57] ABSTRACT

A sputtering apparatus has a pressure resistant vessel, from which gas in discharged and into which gas for sputtering is supplied, a substrate disposed in the vessel to be formed with a film at one surface thereof, a target disposed oppositely to one surface of the substrate to be formed of a substance to become a material of the film, a magnet provided on the surface of the target oppositely to the substrate to generate a magnetic field for confining a plasma in the vicinity of the surface of the target opposed to the substrate, a plate-shaped anode disposed between the substrate and the target to be formed with an opening of the shape in which at least one side is larger than the profile of the substrate at a position opposed to the substrate, and a sputtering current supplier between the anode and the target. The anode is made of a conductor. An opening larger than the profile of the substrate is formed at a position of the anode opposed to the substrate.

11 Claims, 8 Drawing Sheets

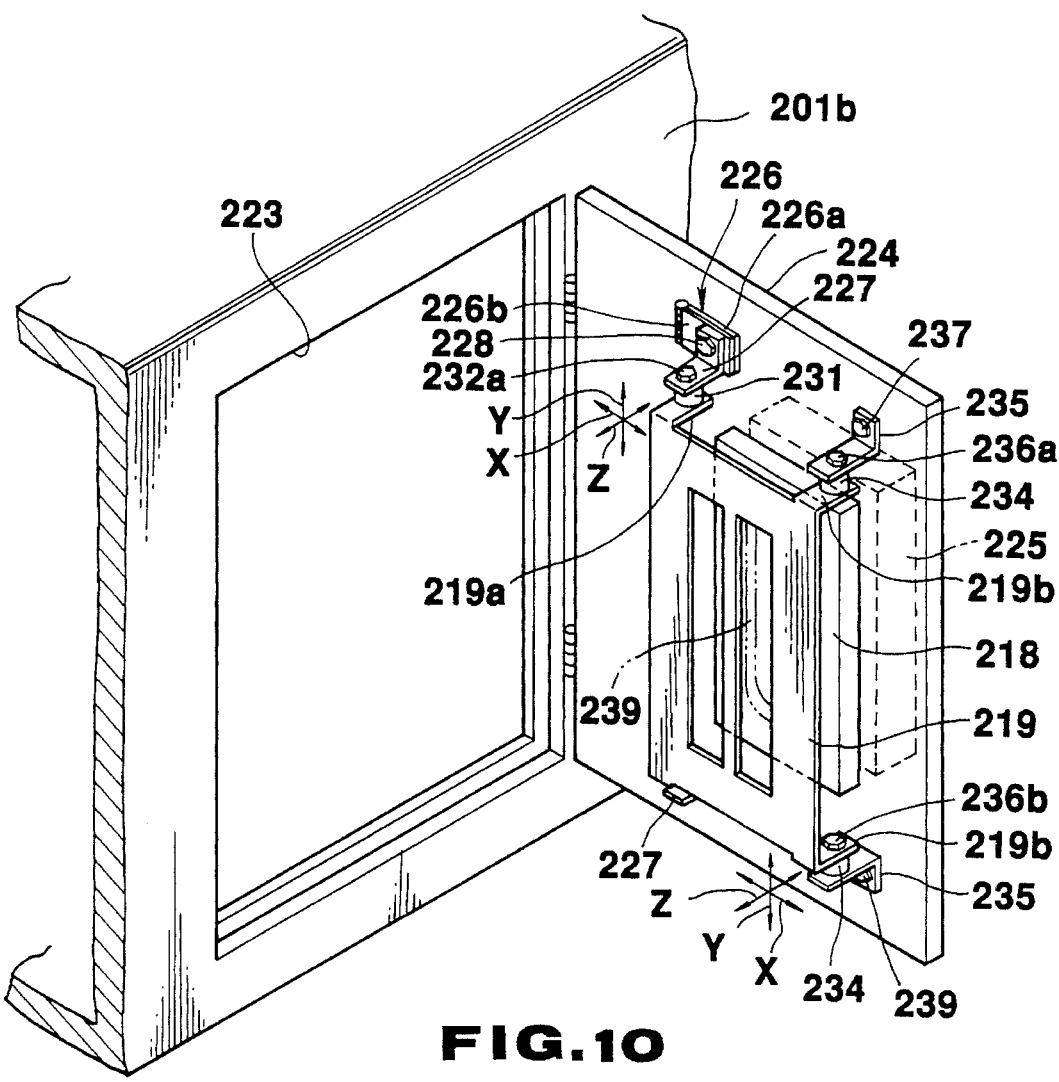
FIG.10
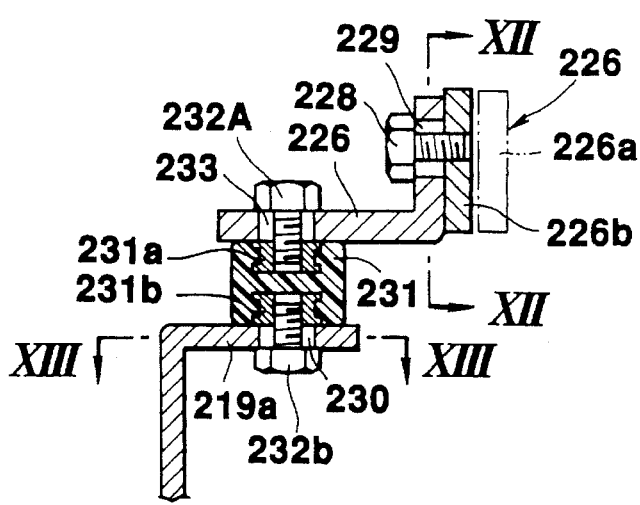
FIG.11
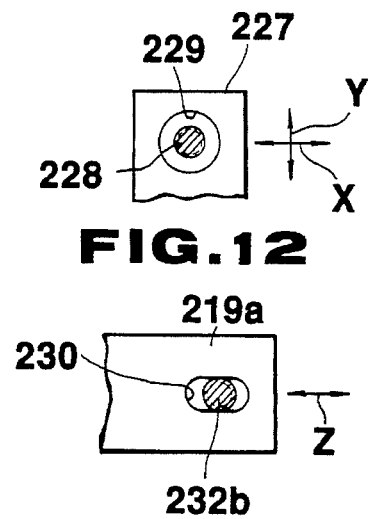
FIG.12
FIG.13

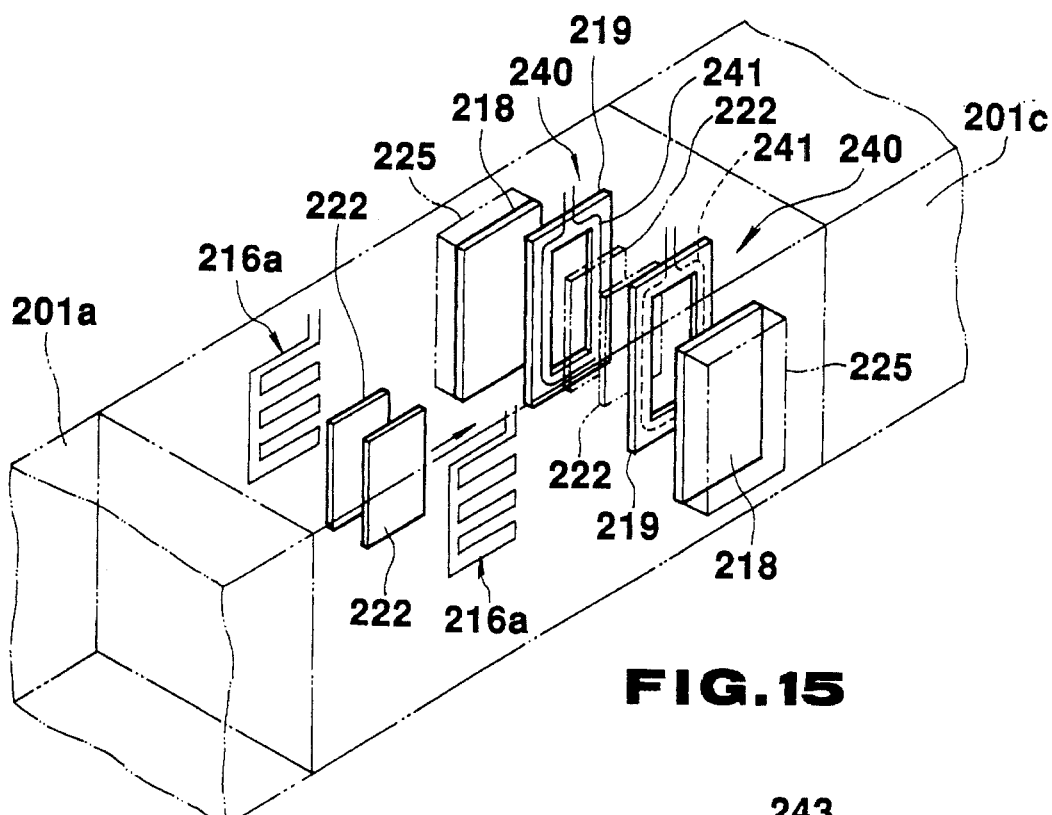
FIG.15
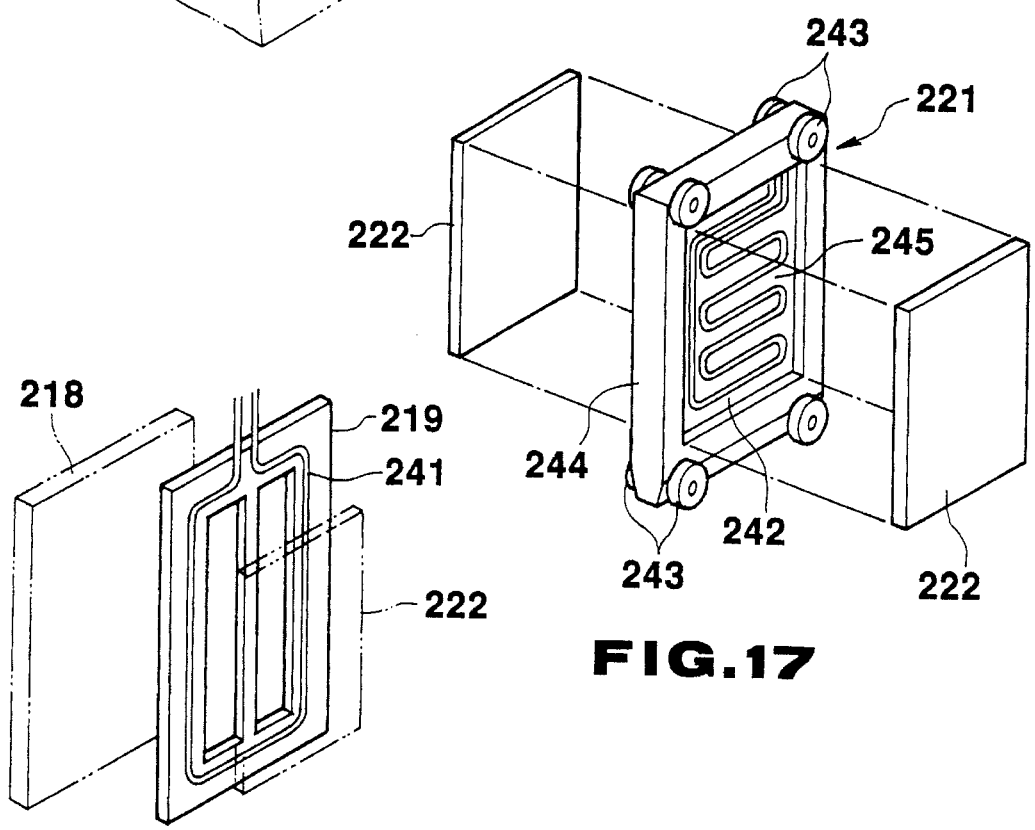
FIG.16
FIG.17

SPUTTERING APPARATUS

This application is a Continuation of application Ser. No. 07/989,951, filed Dec. 10, 1992 abandoned which is a Continuation of Ser. No. 07/869,842, filed Apr. 16, 1992, abandoned which is a continuation of Ser. No. 07/621,357, filed Dec. 3, 1990 (abandoned).

BACKGROUND OF THE INVENTION

1. Field of the Invention

The present invention relates to a magnetron type sputtering apparatus for forming a thin film on a substrate.

2. Description of the Related Art

A magnetron type sputtering apparatus has been widely used as a method of forming a thin film such as a transparent conductive film a metal film or an insulating film on a substrate such as a glass substrate. A conventional magnetron type sputtering apparatus is constructed as shown in FIG. 1 and FIG. 2. More specifically, in a pressure resistant vessel 1, a substrate S to be covered with a desired film, a target T opposed to the substrate S under the substrate S, a magnet M disposed under the target T, and an anode A between the target T and the substrate S are disposed. The magnet M is provided to seal a plasma by a magnetic field, and provided with an S pole around an N pole which is laterally long. The anode A is formed in a loop shape of a conductive wire material and disposed to surround the outer periphery of the substrate S.

This sputtering apparatus generates a plasma by supplying a discharge current between a cathode electrode of the target T and the anode A and sputters with the plasma. The plasma is confined in the surface of the target by a magnetic field indicated by lines f of magnetic force of the magnet M. The target T is sputtered by the plasma confined in the magnetic field of the magnet M, and the sputter particles thus sputtered are flown toward the substrate S, and deposited on the surface of the substrate S. As a result, the target T is cut more on the surface in the portion having higher density of the plasma to form an erosion Ta. Since the erosion Ta becomes high in the density of the plasma on the surface of the target corresponding to an intermediate point between the S pole and the N pole of the magnet M, the erosion Ta is formed in a ring shape on the surface of the target T corresponding to the intermediate point between the S pole and the N pole of the magnet M, and deepened as the sputtering time is elapsed. When the sputtering time becomes long so that the depth of the erosion Ta becomes deep to arrive at the lower surface of the target, the target is replaced.

There is also known an in-line type sputtering apparatus for continuously depositing films on a number of substrates to enhance the efficiency of depositing the films as a sputtering apparatus. The in-line type sputtering apparatus is constructed schematically as shown in FIG. 3. More particularly, in a sputtering chamber 10, an inlet chamber 12 is bonded to the front side of the sputtering chamber 10, and an outlet chamber 13 is bonded to the rear side of the sputtering chamber 10 through airtight doors (not shown). A substrate 1S to be formed with a film is mounted on a substrate carrier (not shown), and introduced into the inlet chamber 12. The inlet chamber 12 is reduced under pressure, the airtight door (not shown) is then opened, and the substrate 1S is carried into the sputtering chamber 10, and formed with a film by sputtering while the substrate 1S is moved in the sputtering chamber 10. Then, the airtight door (not shown) is opened, the substrate 1S is carried into a pressure-reduced outlet chamber 13, the outlet chamber 13 is returned to the atmospheric pressure, and the substrate carrier is then delivered.

A heater 14 for heating the substrate 1S carried into the sputtering chamber 10 is provided in the sputtering chamber 10, and a film forming portion 17 is provided at the rear of the heater 14 (at the front of the substrate 1S in the moving direction). The film forming portion 17 is composed of a target 1T opposed to the film forming surface of the substrate 1S moving in the sputtering chamber 10, a magnet (permanent magnet) 1M disposed behind the target 1T for generating a magnetic field for confining a plasma, and an anode 1A made of a conductive metal wire material disposed opposed to the target 1T.

When a metal oxide film such as, for example, an ITO is formed by this sputtering apparatus, argon gas (Ar) and oxygen gas ($O_2$) are introduced as sputtering gases into the sputtering chamber 10, a sputtering is conducted by the target 1T made of ITO in the sputtering gas atmosphere to form an IT0 on the film forming surface of the substrate 1S. The substrate 1S carried into the sputtering chamber 10 is heated to a predetermined temperature (a temperature capable of forming a film by sputtering) in the step of passing the heater 14 while moving the substrate 1S by a substrate carrier, and formed with a film by sputtering while passing a film forming portion. The sputtering is conducted by supplying a discharge current between a cathode electrode of the target 1T and an anode 1A. A plasma generated by supplying the discharge current is confined in the vicinity of the surface of the target 1T by a magnetic field of the magnet 1M. Sputtering particles sputtered from the target 1T by the plasma are flown toward the substrate 1S, and deposited on the substrate 1S. In the in-line type sputtering apparatus, the target 1T is also cut more, similarly to the above-mentioned sputtering apparatus of FIGS. 1 and 2, on the surface in the higher density of the plasma as the sputtering time is elapsed to form a ring-shaped erosion 1Ta on the surface of the target 1T corresponding to the intermediate point between the S-pole and the N-pole of the magnet 1M. The erosion 1Ta becomes deep as the sputtering time becomes long. When the depth of the erosion 1Ta reaches the lower surface of the target, the target is replaced.

In order to replaced the target, as shown in FIG. 4, an opening 10a is formed at the sidewall of the sputtering chamber 10. The target 1T is attached to the inner surface of an openable door 11 made of a copper plate for sealing the opening, and the door 11 is opened when the target 1T is consumed to its available limit to replace the target 1T.

The magnet 1M is attached to the outer surface of the door 11, and the anode 1A is attached to an anode supporting member 15 provided in the sputtering chamber though an insulating member 16.

The sputtering rates (film depositing efficiency on the substrate S, 1S) of the sputtering apparatuses described above are determined by the discharge current supplied between the target T, 1T and the anode A, 1A. The larger the discharge current is supplied, the higher the sputtering rate becomes.

However, in the conventional sputtering apparatuses described above, there arises a problem that if the discharge current is increased, a discharging state becomes unstable. Therefore, it was difficult to raise the sputtering rate by increasing the discharge current value.

In the conventional sputtering apparatuses described above, the linear anodes A, 1A are disposed to surround the substrates S, 1S. Since a difference in the discharging states occurs above and below the anodes A, 1A and/or at the right and left sides of the peripheries of the anodes A, 1A, the degrees of the progresses of the erosions Ta, 1Ta of the targets T, 1T become irregular as shown in FIG. 1 when the sputtering is repeated. If the erosions Ta, 1Ta of the targets T, 1T are proceeded to the depth arriving at the lower surfaces of the target T, 1T even only at the portions of the targets T, 1T, though the target material having a thickness sufficiently available for use remains under the erosions Ta, 1Ta of the other portion, the targets T, 1T become impossible to be used at this time. Therefore, the above-described conventional sputtering apparatus has a problem in which the utility efficiency of the target A is deteriorated.

In the conventional sputtering apparatuses described above, the target 1T is attached to the inner surface of the openable door 11, and the anode 1A is mounted in the sputtering chamber 10. Therefore, it has a problem that regulation of the position of the anode 1A to the target 1T is very difficult. In other words, in order to regulate the position of the anode 1A to the target 1T, the steps of closing the openable door 11, opposing the target 1T on the inner surface of the openable door 11 to the anode 1A in the sputtering chamber 10, opening the openable door of the sidewall of opposite side to the sputtering chamber 10, checking the position of the anode 1A from the opening of the opposite side, then opening the openable door 11, correcting the position of the anode 1A, again closing the openable door 11, and checking the position of the anode 1A after correction from the opening of the opposite side must be repeated. Accordingly, the above-mentioned conventional sputtering apparatus has a problem that the position regulating work of the anode 1A is very complicated in a low efficiency.

It is an object of the present invention to provide a sputtering apparatus which can solve the above-described problems and produce a stable and uniform discharge state with a large discharge current, thereby enhancing a sputtering rate and forming a film in high efficiency.

SUMMARY OF THE INVENTION

In order to achieve the above-described object, there is provided according to the present invention a sputtering apparatus comprising a pressure resistant vessel; means connected to the pressure resistant vessel for discharging gas in the pressure resistant vessel; means connected to the pressure resistant vessel for supplying gas for sputtering into the pressure resistant vessel; a substrate disposed in the pressure resistant vessel to be formed with a film at least on one surface thereof; a target disposed oppositely to one surface of the substrate in the pressure resistant vessel to be formed of a substance to become a material of the film to be coated on the surface of the substrate; a magnet provided on the surface of said target oppositely to the substrate for generating a magnetic field for confining a plasma in the vicinity of the surface of the target opposed to the substrate; a plate-shaped anode disposed between the substrate and the target to be formed with an opening of the shape in which at least one side is larger than the profile of the substrate at a position opposed to the substrate; and means for supplying a sputtering current between the anode and the target.

According to the sputtering apparatus of the present invention, the anode is formed of the flat plate made of the conductive material having the opening larger at least one side than the profile of the substrate to be formed with the film. Therefore, even if a discharge current is large, a stable discharge state is obtained, thereby enhancing the sputtering rate. Since the anode has the opening equal to the plane which is perpendicular to the target and passes through the intermediate point between the N-pole and the S-pole of the magnet or at the outside therefrom and/or having inner edges at equal distance from the plane, the discharge states of the portions of the target become substantially equal and hence the degrees of progress of the erosions of the target as the sputtering time is elapsed is made uniform, thereby improving the utility efficiency of the target.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 10 is a perspective view showing the partial arrangement of the third embodiment shown in FIG. 9 in detail;

FIG. 11 is a sectional view showing the part of the structure shown in FIG 10;

FIG. 12 is a sectional view taken along a line XII—XII of FIG. 11;

FIG. 13 is a sectional view taken along a line XIII—XIII of FIG. 11;

FIG. 15 is a perspective view showing the part of the second embodiment shown in FIG. 10 in detail;

FIG. 16 is a perspective view showing the enlarged essential arrangement of FIG. 15; and FIG. 17 is a perspective view showing the other embodiment of substrate heating means shown in FIG. 15.

DETAILED DESCRIPTION OF THE PREFERRED EMBODIMENTS

A first embodiment of the present invention will now be described in detail with reference to FIGS. 5 and 6.

Figure 1:
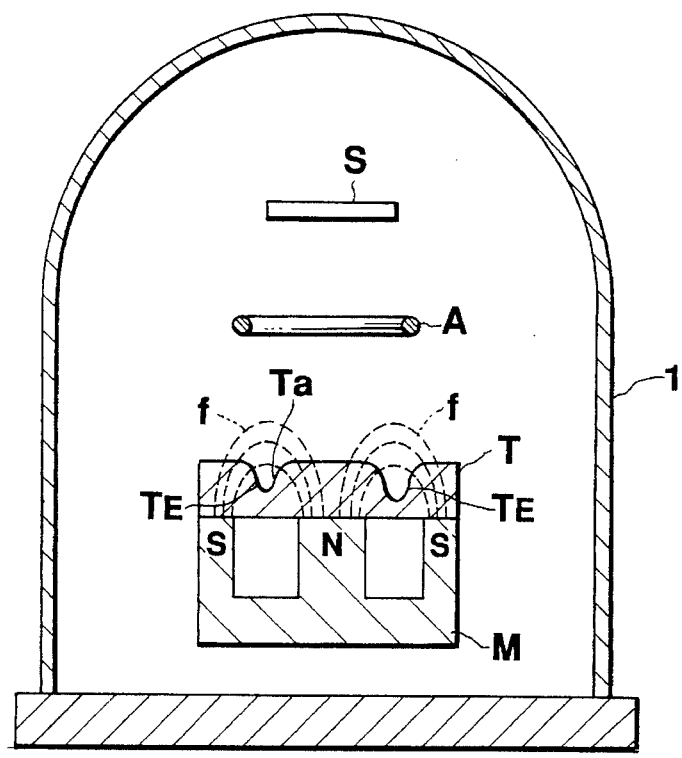
FIG. 1 is a sectional view showing a schematic arrangement of a conventional batch process type sputtering apparatus.
Figure 2:
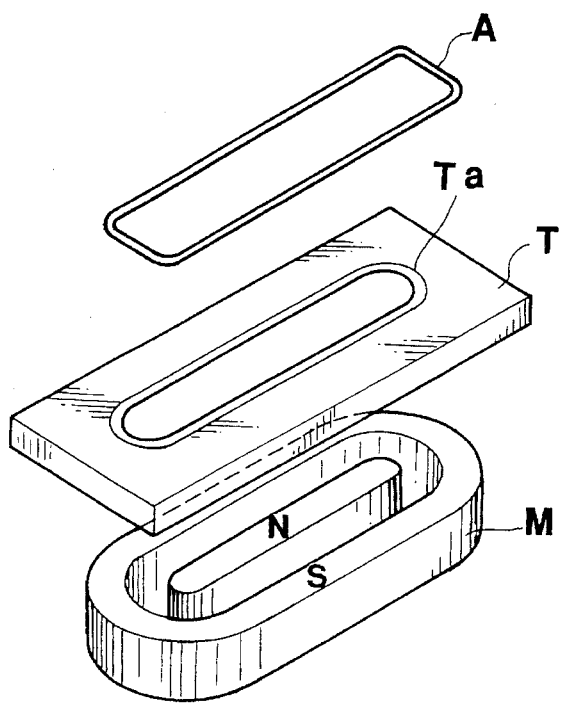
FIG. 2 is a perspective view showing an essential arrangement of the conventional sputtering apparatus shown in FIG. 1.
Figure 3:
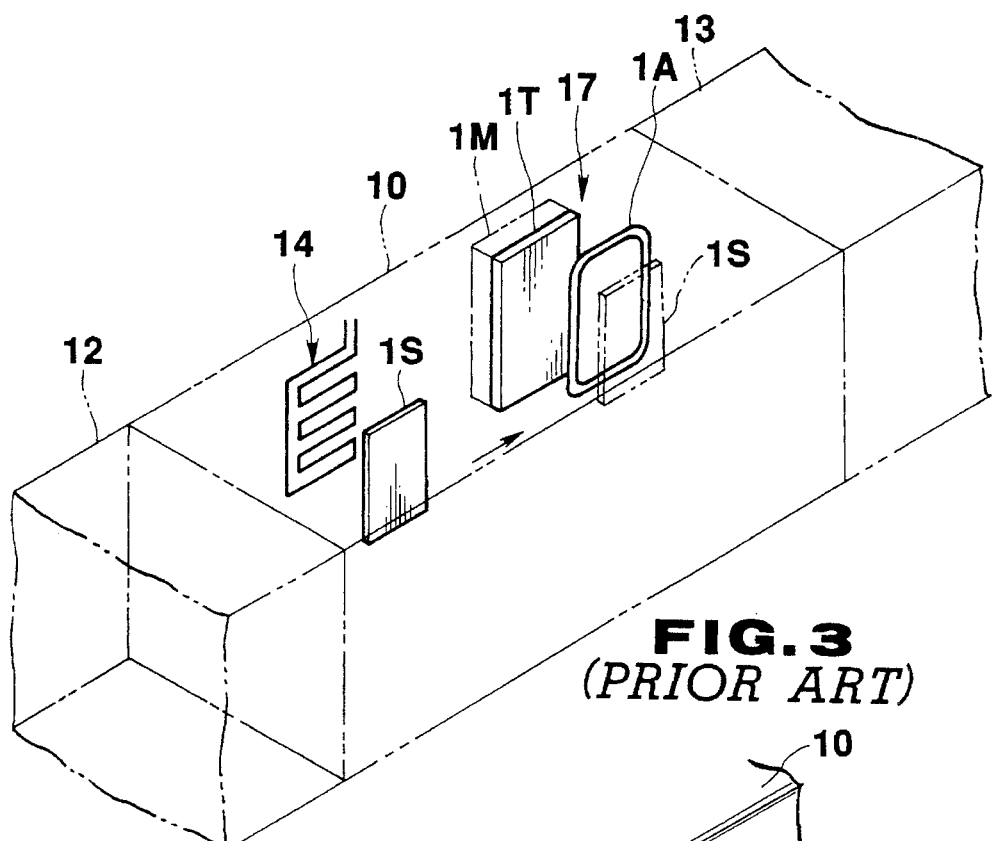
FIG. 3 is a perspective view showing a schematic arrangement of a conventional in-line type sputtering apparatus.
Figure 4:
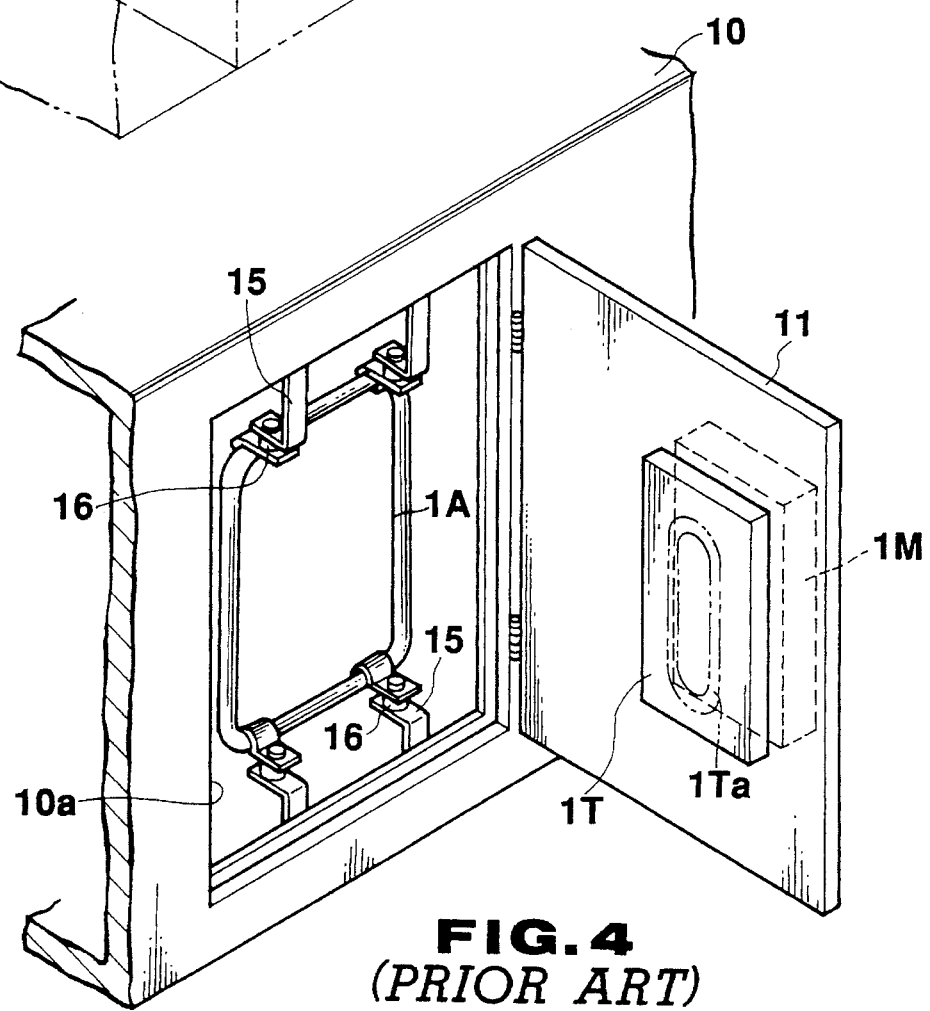
FIG. 4 is a perspective view showing a partial structure of a conventional sputtering apparatus shown in FIG. 3.
Figure 5:
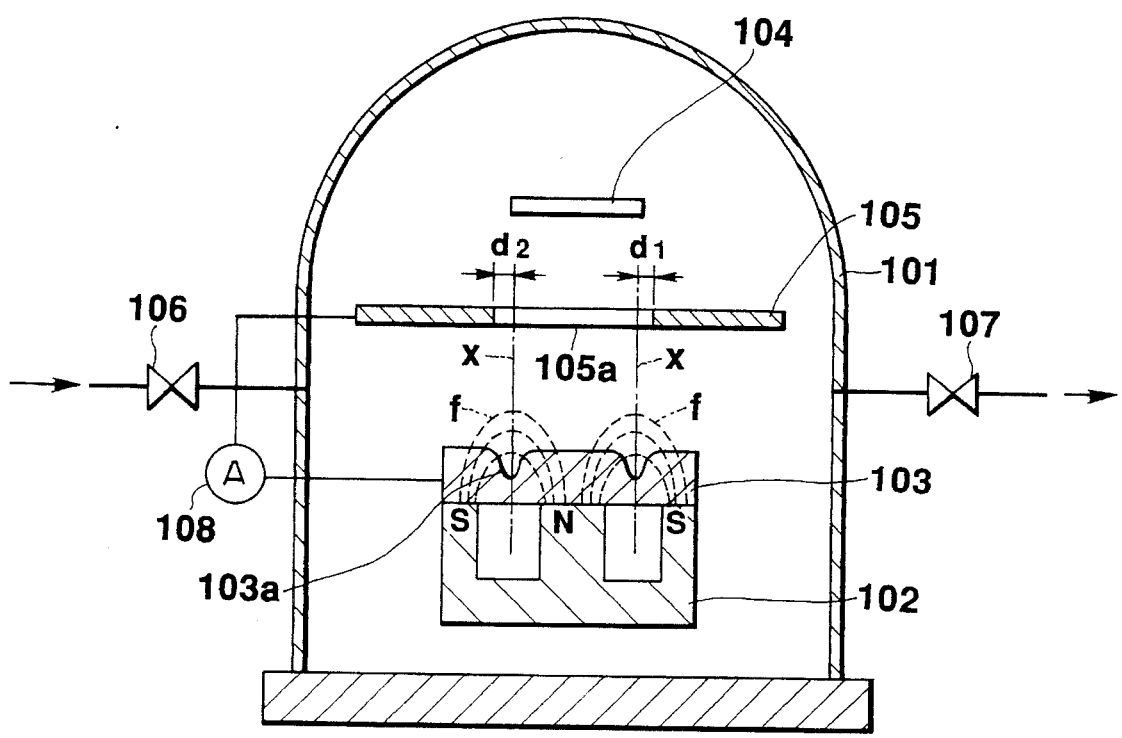
FIG. 5 is a sectional view showing a schematic arrangement of a first embodiment of a sputtering apparatus according to the present invention.
Figure 6:
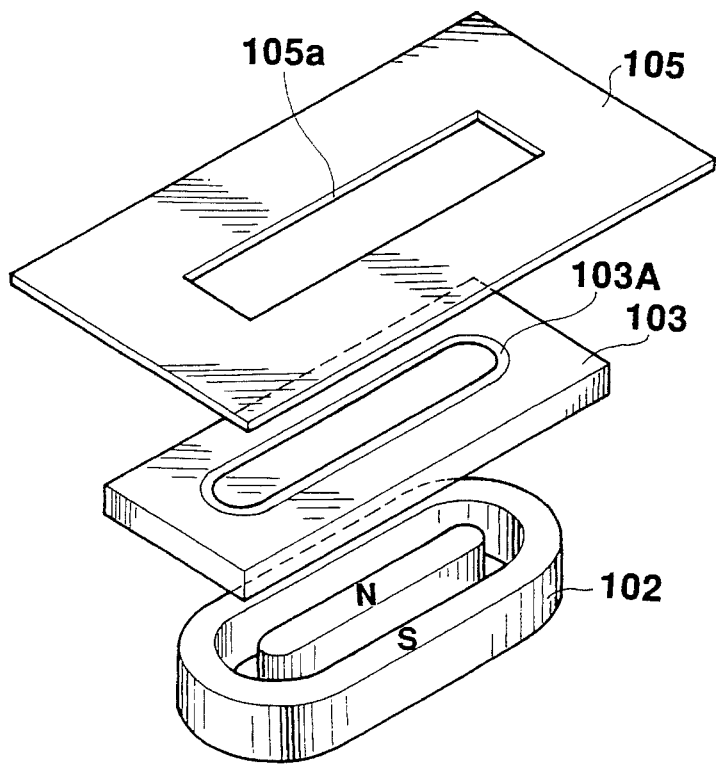
FIG. 6 is a perspective view showing a schematic arrangement of the first embodiment shown in FIG. 5.

In FIGS. 5 and 6, a magnet (permanent magnet) 102 for generating a magnetic field to seal a plasma is disposed in the bottom of a pressure resistant vacuum vessel 101. A loop-shaped S-pole surrounding an N-pole having a laterally long length is formed around the N-pole in the magnet 102 in such a manner that the interval between the N-pole and the S-pole is equal in the entire region. A target 103 is disposed on the magnet 102. A substrate 104 is made of glass or the like, and a film is formed on the substrate 104. The substrate 104 is disposed oppositely to the target 103 above the target 103 in the upper section in the vacuum vessel 101. A discharge current is supplied to an anode 105, which is formed in a flat plate having an opening 105a for passing sputtering particles. The anode 105 is disposed horizontally between the substrate 104 and the target 103. The opening 105a of the anode 105 is larger than the profile of the substrate 104 and has an inner edge coincident with or at an equal distance from a plane x perpendicular to the target 103 through the intermediate point between the N-pole and the S-pole of the magnet 102 (hereinafter referred to as "an intermediate point of the magnet"). In this embodiment, the area of the opening 105a is formed to be slightly larger than that of the region surrounded by the plane x, and the anode 105 is disposed in a state that the distance between the opening edge of the opening 105a and the plane x is equal over the entire periphery of the opening 105a. In other words, a distance $d_1$ between the opening edge of one side of the opening 105a of the anode 105 and the plane 1 and a distance $d_2$ between the opening edge of the other side of the opening 105a and the plane x satisfies $d_1=d_2$. In this embodiment, the opening 105a of the anode 105 is formed in a rectangular shape of laterally long state, while the profile of the magnet 102 is formed in arcuate shapes at the corners, and the distances between the four corners of the opening 105a and the plane x may be formed to be slightly larger than the distances $d_1$, $d_2$ between the opening edges of the other portions and the plane x.

The sputtering apparatus holds a predetermined low pressure state in the vacuum vessel by evacuating the vessel from a discharge valve 107 while supplying sputtering gas from a supply valve 106 and by supplying a discharge current from a power source 108 between the cathode electrode of the target 103 and the anode 105 with the target 103 as a cathode electrode, thereby sputtering. A plasma generated by supplying the discharge current is confined on the surface of the target 103 by the magnetic field of the magnet 102. In FIG. 5, the magnet 102 generates lines f of magnetic force. Sputtering particles sputtered by the plasma confined by the magnetic field of the magnet 102 are flown toward the substrate 104, and deposited on the substrate 104 through the opening 105a of the anode 105.

In the sputtering apparatus as described above, the anode 105 is formed in a flat plate shape having the opening 105a for passing the sputtering particles. Therefore, even if the discharge current is increased, the discharge state is stably held. Accordingly, according to the sputtering apparatus, the sputtering rate can be raised by increasing the discharge current value. Since the opening 105a of the anode 105 is formed in the area larger than that of the region surrounded by the perpendicular plane x passing the intermediate point of the magnet and the distances $d_1$, $d_2$ between the opening edges and the plane x are equal over the entire periphery of the opening 105a as described above, the discharge states of the portions of the target 103 become substantially equal. Therefore, according to the sputtering apparatus described above, the degree of the progress of the erosion 103a of the target 103 becomes uniform as the sputtering time is elapsed, thereby improving the utility efficiency of the target 103. In the embodiment described above, since the distances between the four corners of the opening 150a of the anode 105 and the perpendicular plane x are slightly larger than the distances $d_1$, $d_2$ between the opening edges of the other portions and the plane x, the degree of the progress of the erosion 103a of the target portion corresponding to the portion is slightly different from the other portion, but the progress of the erosion 103a of this target portion is delayed from that of the erosion 103a of the other portion due to the large distance between the opening edge of the anode 105 and the plane x passing the intermediate point of the magnet, there arises no problem.

In the first embodiment described above, the S-pole of the loop shape surrounding the N-pole is formed around the one N-pole in the magnet 102. However, the present invention is not limited to the particular embodiment. For example, when the numbers of the N-poles and S-poles are increased and a plurality of openings 105a are formed correspondingly at the anode 105, the sputtering rate can be raised with the same discharge current value.

Figure 7:
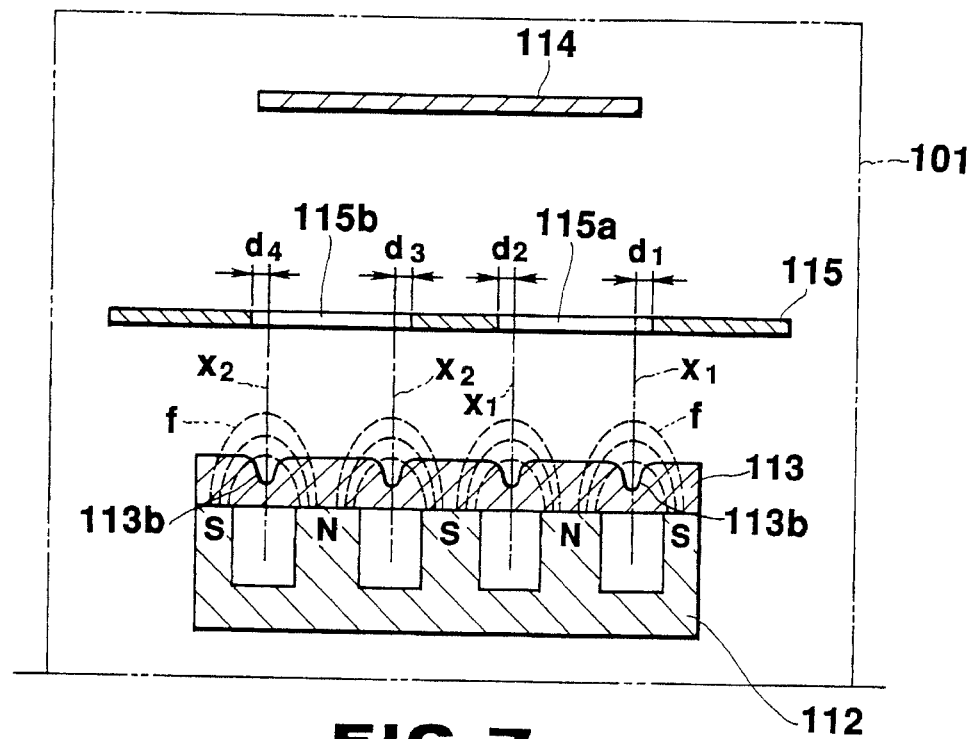
FIG. 7 is a perspective view showing a second embodiment according to the present invention.
Figure 8:
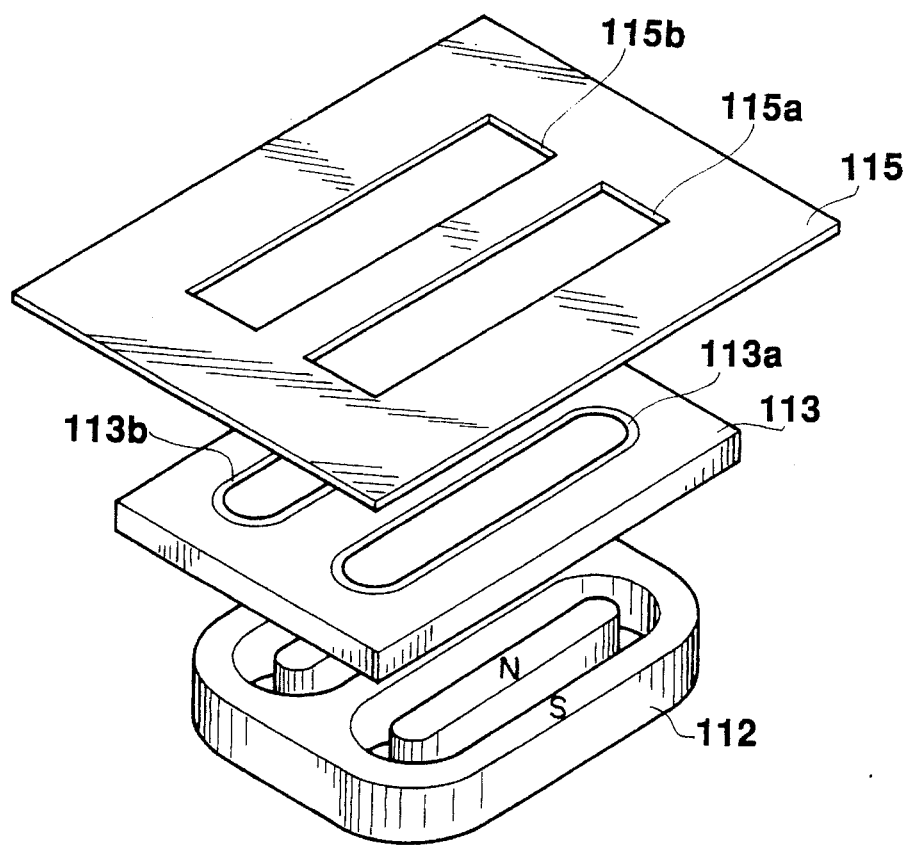
FIG. 8 is a perspective view showing an essential portion of the embodiment shown in FIG. 7.

FIGS. 7 and 8 show a second embodiment of the present invention. In this embodiment, a magnet 112 for confining a plasma is formed with two parallel rows of N-poles each having a laterally long length and with 8-shaped S-poles of loop shape surrounding the respective N-poles around the respective N-poles in such a manner that the intervals between the N-poles and the S-poles are equal in all region. A flat plate-shaped anode 115 disposed horizontally between a substrate 114 and a target 113 is formed with two openings 115a and 115b corresponding to regions surrounded by a plane x2 perpendicular to the target 113 through a region surrounded by a plane $x_1$ perpendicular to the target 113 through the intermediate point (of the magnet) between the one N-pole and the S-pole around the N-pole of the magnet 112 and through a region surrounded by a plane $x_2$ perpendicular to the target 113 through the intermediate point (of the magnet) between the other N-pole and the S-pole around the N-pole of the magnet 112. The two openings 115a and 115b respectively coincide with the planes $x_1$ and $x_2$, or have inner edges at the positions of equal distance from the planes $x_1$ and $x_2$ toward the outside. These two openings 115a and 115b form a substantially larger one opening than the profile of the substrate 114. In this embodiment, the sizes of the openings 115a and 115b are formed to be slightly larger than those of the regions surrounded by the planes $x_1$ and $x_2$. The anode 115 is disposed in a state that the distances between the opening edges of the openings 115a and 115b and the planes $x_1$, $x_2$ are equal over the entire peripheries of the openings 115a and 115b. In other words, distances $d_1$, $d_3$ between the opening edges of one sides of the openings 115a and 115b of the anode 115 and the planes $x_1$, $x_2$ as well as distances d2, d4 between the opening edges of the other sides and the planes $x_1$, $x_2$ satisfy $d_1=d_2=d_3=d_4$. As in this embodiment, the openings 115a, 115b of the anode 115 are formed in rectangular shapes each having a laterally long length, the magnet 112 is formed in an arcuate shape at the corners so that distances between the four corners of the openings 115a and 115b and the planes $x_1$, $x_2$ may be formed to be slightly larger than the distances $d_1$, $d_2$, $d_3$, $d_4$ between the opening edges of the other portion and the planes $x_1$, $x_2$. In FIGS. 7 and 8, the members corresponding to those in FIGS. 5 and 6 are denoted by the same reference numerals, and the description thereof will be omitted.

As in this embodiment, when the magnet 112 for confining the plasma is formed with two rows of N-poles and with S-poles around the respective N-poles and the anode 115 is formed with two openings 115a and 115b corresponding to two regions surrounded by the planes $x_1$, $x_2$ perpendicular to the target through the two intermediate point of the magnets 112, the sputtering rate can be increased by about three times as large as that of the sputtering apparatus shown in FIGS. 5 and 6 by the same discharge current value.

Even in this embodiment, since the openings 115a and 115b of the anode 115 are formed in an area larger than that of the respective regions surrounded by the planes $x_1$, $x_2$ passing the two intermediate points of the magnet 112 and the distances between the opening edges of the openings 115a, 115b and the planes $x_1$, $x_2$ are equal over the entire peripheries of the openings 115a and 115b, the discharge state can be stably held even if the discharge current is increased, and hence the sputtering rate can be raised by increasing the discharge current value similarly to the embodiment described above. Further, the degree of progress of the erosion 113a of the target 113 can be made uniform even in the two erosions corresponding to the two poles as the sputtering time is elapsed, thereby improving the utility efficiency of the target 113.

As in the first and second embodiments described above, the areas of the openings 105a, 115a, 115b of the anodes 105, 115 may be formed to be the same as those of the regions surrounded by the planes $x_1$, $x_2$. In summary, the openings 105a, 115a, 115b of the anodes 105, 115 may be formed in area larger than those of the regions surrounded by the planes $x_1$, $x_2$ and the distances between the opening edges and the planes x, $x_1$, $x_2$ may be formed to be substantially equal over the entire peripheries of the openings 105a, 115a, 115b. When the areas of the openings 105a, 115a, 115b are formed to be the same as those of the regions surrounded by the planes x, $x_1$, $x_2$, the distances $d_1, d_2, d_3, d_4$ between the opening edges and the planes x, $x_1$, $x_2$ satisfy $d_1=d_2=d_3=d_4=$.

In the first and second embodiments described above, the openings 105a, 115a, 115b of the anode 115 are formed in rectangular shapes each having a laterally long length. However, the invention is not limited to the particular embodiments. For example, the openings 105a, 115a, 115b may be formed to be similar to the regions surrounded by the planes x, $x_1$, $x_2$ through the intermediate point of the magnets. Thus, the distances between the opening edges of the openings 105a, 115a, 115b and the planes x, $x_1$, $x_2$ may be formed to be equal over the entire peripheries of the openings, and the degree of progress of the erosion 103a of the target 103 may be uniform in the entire region.

A third embodiment of the present invention applied to an in-line type sputtering apparatus will be described with reference to FIGS. 9 to 16.

Figure 9:
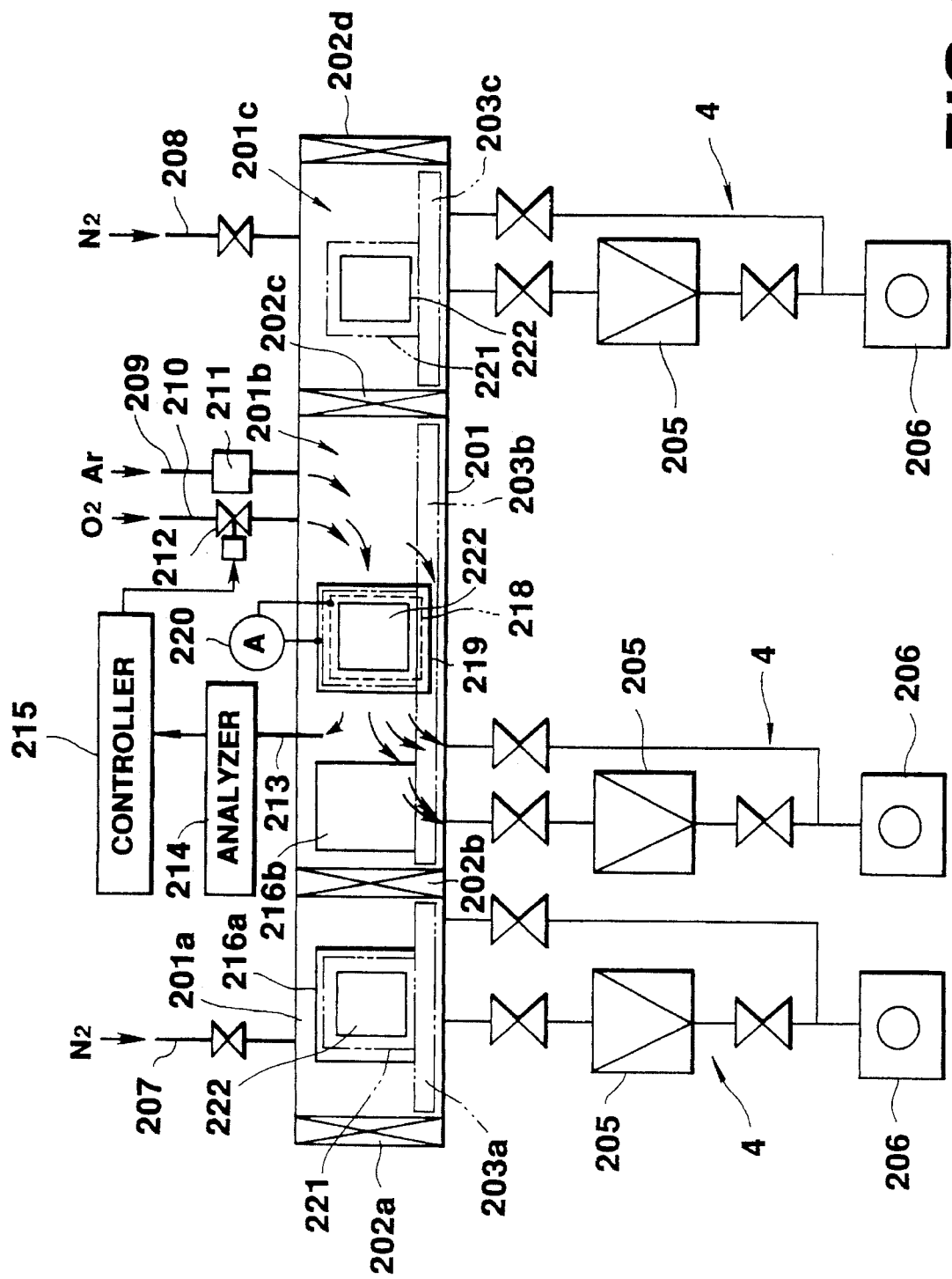
FIG. 9 is a schematic view showing the arrangement of a third embodiment of a sputtering apparatus according to the present invention.

FIG. 9 shows an in-line type transparent conductive film forming apparatus. In FIG. 9, a pressure resistant vessel 300 of a gastight structure is partitioned into a substrate inlet chamber 201a, a sputtering chamber 201b, and a substrate outlet chamber 201c. Door valves 202a, 202b, 202c and 202d of gastight structures are respectively provided in the substrate inlet of the inlet chamber 201a, the boundaries of the chambers 201a, 201b and 201c and the substrate outlet of the outlet chamber 201c. Substrate conveyors 203a, 203b, 203c are respectively provided in the chambers 201a, 201b and 201d. Discharge units 204 are respectively connected to the chambers 201a, 201b and 201c. The discharge unit 204 has a main discharge pump 205 such as a turbo pump, a cryo-pump, an oil diffusion pump, etc. and an auxiliary pump 206 such as an oil rotary pump, etc. Nitrogen gas supply tubes 207 and 208 for supplying nitrogen gas $N_2$ into the inlet chamber 201a and the outlet chamber 201c are respectively connected to the chambers 201a and 201c. An argon gas supply tube 209 for supplying gas in vIII group elements of the periodic table such as argon gas Ar into the sputtering chamber 201b and an oxygen gas supply tube 210 for supplying oxygen gas are connected to the sputtering chamber 201b. In addition to the argon gas, xenon gas, neon gas, etc. may be used as for sputtering a transparent conductive material. A flow rate controller 211 for controlling the supplying flow rate of the argon gas to the sputtering chamber 201b to a predetermined value is provided in the argon gas supply tube 209. The supplying flow rate of the argon gas Ar to be supplied from the argon gas supply tube 209 to the sputtering chamber 201b is always held at a predetermined flow rate by the flow rate controller 211. A flow rate control valve 212 is provided in the oxygen gas supply tube 210, and the supplying flow rate of the oxygen gas $O_2$ to be supplied from the oxygen gas supply tube 210 to the sputtering chamber 201b is controlled by the flow rate control valve 212.

On the other hand, a sampling tube 213 for intaking atmospheric gas (mixture gas of argon gas and oxygen gas) in the sputtering chamber 201b is connected to the sputtering chamber 201b, and an analyzer 214 for analyzing the state of sputtering gas such as oxygen partial pressure, etc., in the sputtering chamber 201b is connected to the sampling tube 213. The output of the analyzer 214 is input to a controller 215, thereby controlling a flow rate control valve 212 provided in the oxygen gas supply tube 210 to supply predetermined amount of oxygen gas.

In FIG. 9, substrate heaters 216a, 216b and a heater 217 shown in FIGS. 15 and 16 are provided in the inlet chamber 201a and the sputtering chamber 201b. A target 218 formed of a transparent conductive material such as ITO, etc., made of oxide and an anode 219 disposed at a position opposed to the target 218 are arranged in the sputtering chamber 201b, and a power source 220 for supplying a sputtering current is connected to the target 218 and the anode 219.

A method of forming a transparent conductive film by the above-described in-line type transparent conductive film forming apparatus will be described in the case where an ITO film is formed on the surface of a glass substrate for a liquid crystal display device. Before a process for forming the ITO film, a target 218 made of ITO is first set in the sputtering chamber 201b, all the door valves 202a, 202b, 202c and 202d are then closed, the air in the chambers 201a, 201b and 201c are discharged by the discharge units 204 to evacuate in high vacuum the respective chambers 201a, 201b, and 210c. Then, nitrogen gas $N_2$ is supplied from the nitrogen gas supply tube 207 into the inlet chamber 201a, the internal pressure in the inlet chamber 201a is set to the same pressure as the atmospheric pressure, the door valve 202a of the inlet of the chamber 201a is then opened, and the glass substrate 222 secured to a carrier 221 is set on the substrate conveyor 203a in the inlet chamber 201a. In order to maintain the nitrogen gas atmosphere in the inlet chamber 201a during the conveying work of the substrate 222 into the inlet chamber 201a, nitrogen gas supply from the nitrogen gas supply tube 207 is continued. Then, after the door valve 202a is closed, the inlet chamber 201a is evacuated in high vacuum state by the discharge unit 204. While the inlet chamber 201a is evacuated in high vacuum, the substrate 222 is heated by the heater 216a. When the chamber 201a becomes a predetermined pressure (to approx. $5 \times 10^{-6}$ Torr), the door valve 202b between the inlet chamber 201a and the sputtering chamber 201b is opened, the substrate 222 in the chamber 201a is fed onto the substrate conveyor 203 in the sputtering chamber 201b, and the door valve 202b is then closed. When the door valve 201b is closed, next substrate is inserted into the inlet chamber 201a similarly to the above.

On the other hand, when the substrate 222 is fed into the sputtering chamber 201b and the door valve 202b is closed, the argon gas Ar and the oxygen gas $O_2$ are supplied from the argon gas supply tube 209 and the oxygen gas supply tube 210 into the sputtering chamber 201b, and sputtering atmospheric gas of the mixture gas of the argon gas Ar and the oxygen gas $O_2$ is filled in the sputtering chamber 201b. The gas pressure of the sputtering atmospheric gas is controlled so that the entire pressure becomes 1 to 20 mTorr by continuing the gas supply from the argon gas supply tube 209 and the oxygen gas supply tube 210 and continuously discharging the atmospheric gas in the sputtering chamber 201b by the discharge unit 204. In the meantime, the substrate 222 is heated by the heater 216b. When the atmospheric gas pressure is stabilized, the substrate 222 is conveyed at a predetermined speed by the substrate conveyor 203b, a sputtering current is simultaneously supplied to the target 218, thereby starting a sputter discharge.

When the target 218 is sputter discharged by supplying electric energy thereto, the ITO sputtered from the target 218 is sequentially deposited on the surface of the substrate 222 passing at a predetermined speed under the target 218 to form an ITO film having a predetermined thickness on the substrate 222. When the substrate 222 completely passes under the target 218, the sputter discharge is stopped, and the supplies of the argon gas Ar and the oxygen gas O2 are stopped as well. Thereafter, the door valve 202c between the sputtering chamber 201b and the outlet chamber 202c is opened, the ITO film forming substrate 222 in the sputtering chamber 201c is fed on the substrate conveyor 203c in the chamber 201c, and the door valve 202c is closed. On the other hand, the substrate 222 in the inlet chamber 201a is fed into the sputtering chamber 201b by opening the door valve 202b between the inlet chamber 201a and the sputtering chamber 201b, and the door vale 202b is then closed. When the door valves 202b, 202c are closed, the sputtering chamber 201b is processed to form an ITO film similarly to the above, the ITO film forming substrate 222 fed to the outlet chamber 201c is conveyed out by supplying the nitrogen gas $N_2$ from the nitrogen gas supply tube 208 into the outlet chamber 201c, setting the internal pressure in the outlet chamber 201c to the same as the atmospheric pressure, and then opening the door valve 202d. The door valve 202d is closed after the substrate 222 is removed, and then the outlet chamber 201c is again evacuated in high vacuum.

In the sputtering apparatus of FIG. 9 described above, the target, the anode, etc. to be disposed in the sputtering chamber 201b are attached as below.

Figure 14:
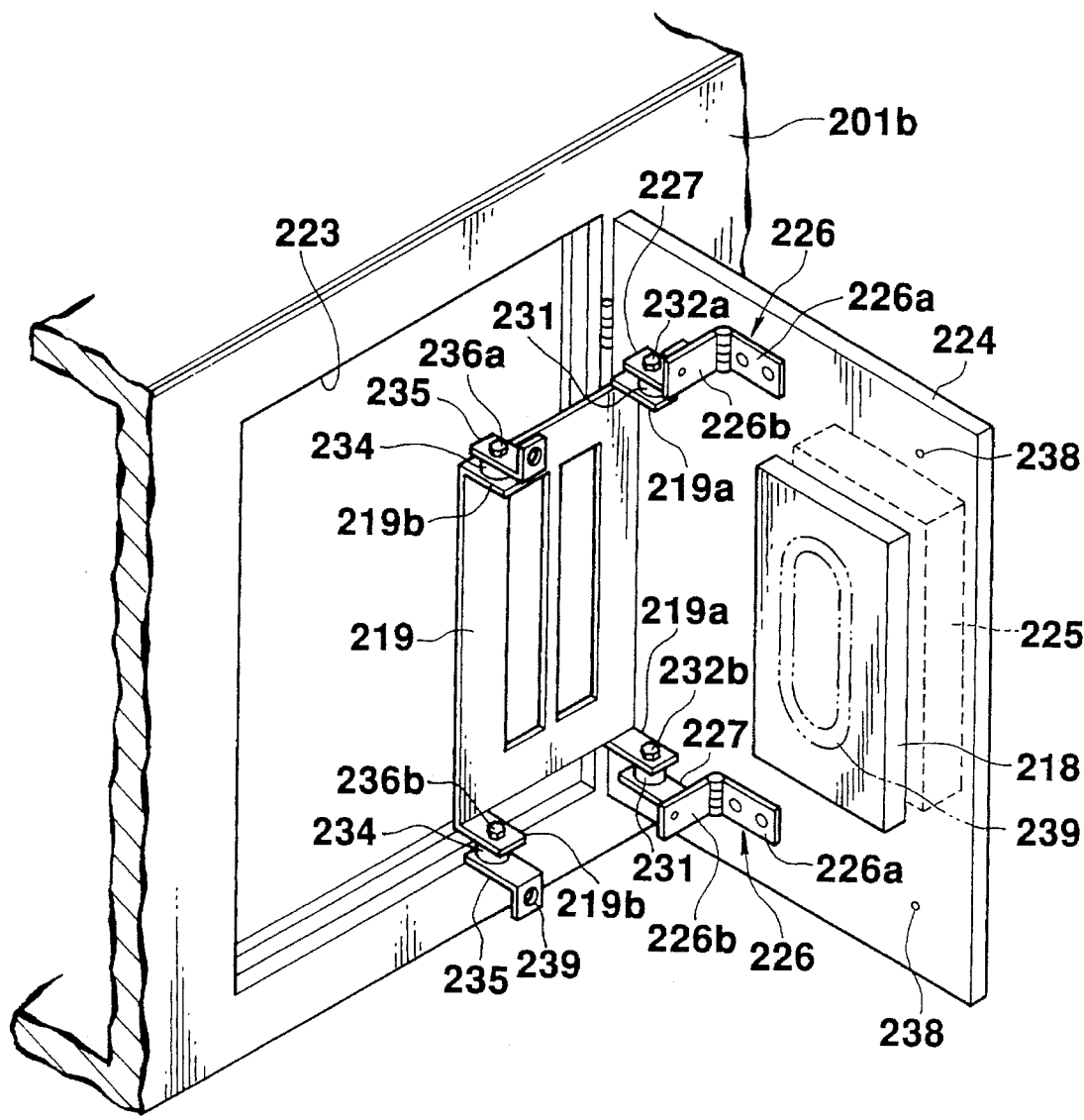
FIG. 14 is a perspective view showing the state that the anode in FIG. 10 is released.

In FIGS. 10 and 14, an opening 223 is formed at the sidewall of the sputtering chamber 201b, and an openable door 224 made of a copper plate for sealing the opening 223 is provided at the sidewall. The target 218 is attached to the inner surface of the openable door 224, and a magnet (permanent magnet) 225 for generating a magnetic field for confining a plasma is attached to the outer surface of the door 224. An anode 219 of a frame plate shape made of a conductive metal plate is disposed oppositely to the target 218. This anode 219 is supported to the door 224 to be adjustably at the position to the target 218 of the inner surface of the door 224.

The supporting structure of the anode 219 to the door 224 will be described. A pair of upper and lower hinge members 225 are attached to the inner surface of the door 224 so as to be capable of rotatably attaching the anode 219, the hinge members 226 are disposed so that its hinge shaft sides are directed toward the sputtering chamber 201b, and the stationary side hinge pieces 226a are clamped at the door 224. An anode supporting member made of an L-shaped steel plate (hereinafter referred to as "a hinge side anode supporting member") 227 is attached movably in upward and downward directions (longitudinal directions of the target 218) Y and in rightward and leftward directions (lateral directions of the target 215) X to the outer surface of the movable side hinge piece 226b of the hinge member 226. In other words, the hinge side anode supporting member 227 is clamped at the vertical plate portion to the movable side hinge piece 226n of the hinge member 226 with a bolt 228, and attached to the movable side hinge piece 226b. A bolt insertion hole 229 opened at the vertical plate portion of the hinge side anode supporting member 227 is formed, as shown in FIGS. 11 and 12, in a circular hole having a diameter sufficiently larger than that of the shaft portion of the bolt 228, and the hinge side anode supporting member 227 is regulated movably in the upward and downward directions Y and the rightward and leftward directions X at a gap between the bolt insertion hole 229 and the bolt shaft portion by loosening the bolt 228.

On the other hand, horizontally bent pieces 219a and 219b bent perpendicularly to the surface of the anode 219 are formed at the upper and lower edges of one side of the anode 219 and at the upper and lower edges of the other side of the anode 219. Bent pieces 230a formed at the upper and lower edges of one side of the anode 219 are supported, as shown in FIG. 11, to the horizontal plate portion of the hinge side anode supporting member 227 through an insulation porcelain 231, and clamped fixedly by bolts 232a, 232b. In other words, the insulation porcelains 231 are buried with nuts 231a, 231b in a state insulated from each other at both ends. One end side of the porcelain 231 is clamped fixedly at the horizontal plate portion of the hinge side anode supporting member 227 with a bolt 232a, and the bent piece 219a of the anode 219 is clamped fixedly at the other end side of the porcelain 231 with a bolt 232b. A bolt insertion hole 230 opened at the bent piece 219a is formed in a long hole as shown in FIGS. 11 and 13, and the anode 219 is regulated movably in the forward and reverse directions (in a direction separate from or contact with the target 218) by loosening the bolt 232b. In this embodiment described above, a bolt insertion hole 233 opened at the horizontal plate portion of the hinge side anode supporting member 227 is also formed in a long hole as shown in FIG. 11. Thus, the anode 219 can be regulated movably in forward and reverse directions by loosening the bolt 232a clamped at the porcelain 231 to the hinge side anode supporting member 227.

Stationary side anode supporting members 235 made of L-shaped steel plates are attached movably in forward and reverse directions to the bent pieces 219b formed at the upper and lower edges of the other side of the anode 219 through insulation porcelains 234. The porcelains 234 are buried similarly to the porcelains 231 described above in a state insulated from each other at both ends. The one end side of the porcelain 234 is clamped at the horizontal plate portion of the stationary side anode supporting member 235 with a bolt 236a, and the bent piece 219b of the anode 219 is clamped at the other end side of the porcelain 234 with a bolt 236b. The stationary side anode supporting member 235 is clamped at the openable door 224 at the vertical plate portion with a bolt 237 to be detachably attached to the openable door 224, and the anode 219 is supported to the door 224 by the stationary side anode supporting member 235, the hinge side anode supporting member 227 and a hinge member 226. In FIG. 14, an engaging hole 238 of the bolt 237 for clamping the vertical plate portion of the stationary side anode supporting member 235, is provided at the door 224 is formed at the door 224. Bolt insertion holes (not shown) opened at the horizontal plate portions of the bent piece 219b and the stationary side anode supporting member 227 are both formed in long holes, and the stationary side anode supporting member 235 is regulated movably in forward and reverse directions Z to the anode 219 by loosening any of the bolts 236a, 237a. A bolt insertion hole 239 (FIG. 5) opened at the vertical plate portion of the stationary side anode supporting member 235 is formed in a circular shape having a diameter sufficiently larger than that of the shaft portion of the bolt 237, and the stationary side anode supporting member 235 is regulated movably in upward and downward directions Y and rightward and leftward directions X by loosening the bolt 237.

More specifically, the anode 219 is attached movably in upward and downward directions Y and rightward and leftward directions X to the movable side hinge piece 226b of the hinge member 226 for securing the hinge side anode supporting member 227 to the openable door 224, and attached movably in the upward and down10 ward directions Y and rightward and leftward directions X at the stationary side anode supporting member 235 to the door 224 to regulate the target 218 longitudinally and laterally. Further, the gap to the target 218 can be regulated by relatively movably regulating the hinge side anode supporting member 227 and the stationary side anode supporting member 235 relative to the anode 219 in forward and reverse directions Z. The anode 219 can be rotated separately from or contact with the door 224 as shown in FIG. 14 by removing the bolt 237 for clamping the stationary side anode supporting member 235 at the door 224 since the hinge side anode supporting member 235 for supporting one side of the anode 219 is attached to the door 224 through the hinge member 226.

In the sputtering apparatus of the embodiment described above, the anode 219 is supported to be regulated at the position to the door 224 for attaching the target 218. Accordingly, the position of the anode 219 can be regulated in longitudinal directions (Y directions) and lateral directions (X directions) of the target 218 in directions (Z directions) for separating from or contact with the target 218 in the state that the door 224 is opened as shown in FIG. 10 while directly checking the position of the anode 219 to the target 218. Therefore, the position of the anode 219 can be readily regulated with satisfactory operability.

In the sputtering apparatus, the anode 219 is rotated to be separated from or contact with the door 224. Accordingly, when the target 218 is replaced, the anode 219 can be retracted to the position not for disturbing the replacement of the target as shown in FIG. 14, and hence the anode 219 is supported to the door 224 attached with the target 218, but the replacement of the target 218 can be also facilitated.

In the embodiment described above, the anode 219 can be regulated not only in the longitudinal directions (Y directions) and the lateral directions (X directions) of the target 218 but in the direction for separating from or contact with the target 218 (Z directions). However, the factors for affecting influences largely to the discharge state are the positional relationship between the erosion 239 generated particularly at the target 218 and the opening edges of the anode 219, and the change of the discharge state due to the interval between the target 218 and the anode 219 can be regulated by controlling the discharge current flowing between the target 218 to become the cathode electrode and the anode 219. Therefore, the anode 219 may not be regulated at the position in the directions (Z directions) for separating from or contacting with the target 218.

In the embodiment described above, the anode 219 is supported to the door 224 through the hinge side anode supporting member 227 and the hinge member 226, the stationary side anode supporting member 235. However, the structure in which the anode 219 is supported to be regulated at the position to the door 224 is not limited to the particular embodiment, but an arbitrary mechanism may also be employed.

A substrate heater is provided in addition to the heater in the sputtering chamber 201b shown in FIG. 9 described above. In other words, as shown in FIGS. 16 and 16, the sputtering apparatus has means for heating the substrate 222 during film forming to a predetermined temperature. More specifically, a substrate heater 241 for heating a substrate 222 to be formed with a film while passing a film forming portion 240 is provided in the vicinity of the anode 218 of the film forming portion 240 in the sputtering chamber 201b. The substrate heater 241 is provided around an opening for passing sputtering particles of the anode 218 at the surface of the anode 218 opposed to the substrate 222. The substrate heater 241 may be, for example, an infrared ray heater, and is connected to a heater controller (not shown).

The sputtering apparatus is provided to heat the substrate 222 conveyed in the sputtering chamber 201a by the substrate carrier 221 to a predetermined temperature in the step of passing the heater 216a and to heat the substrate 222 to the predetermined temperature in case of passing the film forming portion 240. Accordingly, the substrate 222 passing the film forming portion 240 is formed with a film by sputtering while heating by the radiation heat from the substrate heater 241 provided at the anode 219 of the film forming portion 240.

Therefore, according to the sputtering apparatus described above, even if the substrate 222 heated by the heater 216b is lowered at its temperature by the radiation of the heat during moving to the film forming portion 240, the substrate 222 can be heated to be raised at its temperature by heating it by the substrate heater 241 at the film forming portion 240. Accordingly, the substrate temperature during film forming while passing the film forming portion 240 can be maintained at the temperature for preferably depositing sputtering particles to form a film of high quality on the substrate by controlling the temperature of the substrate heater 241.

In the embodiment described above, the substrate heater 241 of the film forming portion 240 is provided on the surface of the anode 219 opposed to the substrate 222. However, the invention is not limited to the particular embodiment. For example, the substrate heater 241 may be provided between the anode 219 and the substrate 222.

In the embodiment described above, the substrate heater 241 for heating the substrate 222 during film forming is provided in the film forming portion 240. However, the substrate heater 241 may also be provided to be moved together with the substrate 222, and the structure will be shown in FIG. 17.

This substrate heating means has a substrate heater 242 provided on a substrate carrier 221 for conveying a substrate 222 for heating a substrate 222 during film forming. The substrate carrier 221 is formed with a substrate holding recess 245 for holding to contain the substrate 222 in a carrier body 244 having wheels 243 running on rails (not shown), and the two substrate 242 is provided in the deep bottom of the recess 245. In this embodiment, two film forming substrates A are held back-to-back on the substrate carrier 221 and films are simultaneously formed on the two substrates 222 in a sputtering apparatus. The substrate carrier 221 is formed with the substrate holding recesses 345 on both side surfaces of the carrier body 224, and the substrate heaters 242 are respectively provided in the deep bottoms of both the recesses 245, or buried in the bottom walls of both the recesses 245 (in the partition walls for partitioning the recesses 245) to be held in the recesses 245 to commonly heat the two substrate 222 held in the recesses 245. The substrate heater 242 is connected, for example, to a heater controller through a reel-wound cable (not shown) fed out or wound as the substrate carrier 221 is moved.

More specifically, in the embodiment described above, the substrate heater 242 is provided in the substrate carrier 221 for conveying the substrate 222 to heat the substrate 221 during film forming. According to the embodiment, since the substrate 222 conveyed by the substrate carrier 221 can be always heated to a predetermined temperature during conveying, the substrate temperature can be maintained at the temperature for preferably depositing the sputtering particles on the substrate during film forming to form a film of high quality. According to the substrate heating means of FIG. 17, the heater 216b provided in the sputtering chamber 201b of the sputtering apparatus shown in FIG. 15 can be eliminated.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A sputtering apparatus comprising:

a pressure resistant vessel;

means coupled to said pressure resistant vessel, for discharging gas from said pressure resistant vessel;

means coupled to said pressure resistant vessel, for supplying gas for sputtering into said pressure resistant vessel;

a substrate disposed in said pressure resistant vessel to be formed with a film at least on one surface thereof;

a target disposed opposite to said one surface of said substrate in said pressure resistant vessel, and formed of a substance to become a material of the film to be coated on said surface of said substrate;

an anode disposed between said substrate and said target, said anode being arranged substantially parallel to said target and having one surface facing toward said target;

a magnet provided at a back side of a target opposing surface of said substrate, for generating a magnetic field to confine a plasma produced between said target and said anode in the vicinity of the substrate opposing surface of said target, said magnet having at least two pairs of N and S poles;

in each pair of said N and S poles, one of the poles being surrounded by the other of the poles, and the at least two pairs of N and S poles being independently located side by side;

said anode comprising a substantially flat plate-shaped anode, said plate-shaped anode having a portion covering said target, and said plate-shaped anode having at least two openings corresponding to the at least two pairs of N and S poles of said magnet, the at least two openings having at least two edges corresponding to at least two regions in each of which the plasma generated between said target and said anode is confined by the magnetic field generated between the N and S poles of each of said pairs, each of the openings having an inner edge which extends at a position between a plane, passing through an intermediate point between one of the corresponding one pair of the N and S poles of said magnet and being substantially perpendicular to said target, and the outer located one of the corresponding one pair of the N and S poles; and means for supplying a sputtering current to said anode and to said target.

2. A sputtering apparatus according to claim 1, wherein the inner edge of each of the openings of said anode is disposed to be coincident with the plane which is substantially perpendicular to said target and passes through the intermediate point between the S pole and N pole of the corresponding one pair of said magnet.

3. A sputtering apparatus comprising:

a first pressure resistant vessel including an inlet chamber, a sealable inlet door for introducing a substrate into the inlet chamber, an inert gas supply source, and a vacuum pump for discharging gas from the inlet chamber;

said first pressure resistant vessel further including a film forming chamber and two sealable partition doors for sealing the film forming chamber, one of the sealable partition doors being arranged between the film forming chamber and the inlet chamber to introduce the substrate on a surface of which a predetermined film is to be formed, from the inlet chamber into the film forming chamber, and the film forming chamber being connected to a sputtering gas supply source and a vacuum pump for discharging gas from the film forming chamber to reduce a pressure of gas in the film forming chamber to a predetermined value;

a target, formed of a substance to become a material of the film to be coated on the surface of the substrate, and disposed in the film forming chamber so as to oppose the surface of the substrate introduced into the film forming chamber;

an anode disposed between the substrate and said target, said anode being arranged substantially parallel to said target and having one surface facing toward said target;

a magnet provided at a back side of a target opposing surface of the substrate, for generating a magnetic field to confine a plasma produced between said target and said anode in the vicinity of the substrate opposing surface of said target, said magnet having at least two pairs of N and S poles, in each pair of N and S poles one of the poles beings surrounded by the other of the poles, and the at least two pairs of N and S poles being independently located side by side;

said anode comprising a substantially flat plate-shaped anode, said plate-shaped anode having a portion covering said target, and said plate-shaped anode having at least two openings corresponding to the at least two pairs of N and S poles of said magnet, the at least two openings having at least two edges corresponding to at least two regions in each of which the plasma generated between said target and said anode is confined by the magnetic field generated between the N and S poles of each pair, each of said openings having an inner edge which extends at a position between a plane, passing through an intermediate point between one of the N and S poles and the other in the corresponding one pair of said magnet and being substantially perpendicular to said target, and the outer located one of the N and S poles in the corresponding one pair of said magnet;

means for supplying a sputtering current to said anode and to said target;

a second pressure resistant vessel in which an outlet chamber, connected to the film forming chamber through the other of the sealable partition doors of the film forming chamber, and a sealable outlet door for conveying out the film coated substrate which is introduced into the outlet chamber from the film forming chamber are provided, and the outlet chamber being connected to an inert gas supply source and a vacuum pump for discharging gas from the outlet chamber; and conveying means for conveying the substrate from the inlet chamber to the outlet chamber through the film forming chamber.

4. A sputtering apparatus according to claim 3, wherein the inner edge of each of the openings of said anode is disposed to be coincident with the plane which is perpendicular to said target and passes through the intermediate point between the S pole and the N pole in the corresponding one pair of said magnet.

5. A sputtering apparatus according to claim 3, wherein:

said conveying means has a holder for holding two substrates on opposed surfaces thereof; and said target and said anode are respectively disposed at both sides of said holder to oppose to the respective substrates.

6. A sputtering apparatus according to claim 5, further comprising:

means for heating said substrate during film forming in said film forming chamber.

7. A sputtering apparatus according to claim 6, wherein said heating means comprises a heater disposed in the vicinity of the surface of said anode, said surface of said anode opposing said substrate film forming chamber oppositely to said substrate.

8. A sputtering apparatus according to claim 7, wherein said heating means is a heater provided in the holder of said conveying means.

9. A sputtering apparatus according to claim 8, wherein said heater is provided at a position interposed between two substrates held by said holder.

10. A sputtering apparatus according to claim 3, further comprising:

a door slidably provided on said film forming chamber and attached with said target; and fixing means for fixing said anode at said door so that the position of said anode with reference to said door can be regulated.

11. A sputtering apparatus according to claim 10, wherein said fixing means comprises a supporting member connected to said door by a hinge, said anode is fixed to said supporting member, and said supporting member is rotatable around said hinge so as to be moveable from a position in which said anode on said supporting member opposes said target on said door.

* * * * *